United States Patent
Liu et al.

(10) Patent No.: US 10,516,348 B2
(45) Date of Patent: Dec. 24, 2019

(54) MEMS ACTUATOR PACKAGE ARCHITECTURE

(71) Applicant: MEMS Drive Inc., Pasadena, CA (US)

(72) Inventors: Xiaolei Liu, South Pasadena, CA (US); Guiqin Wang, Arcadia, CA (US); Matthew Ng, Rosemead, CA (US)

(73) Assignee: MEMS Drive Inc., Arcadia, CA (US)

( * ) Notice: Subject to any disclaimer, the term of this patent is extended or adjusted under 35 U.S.C. 154(b) by 749 days.

(21) Appl. No.: 15/012,682

(22) Filed: Feb. 1, 2016

(65) Prior Publication Data
US 2017/0133950 A1     May 11, 2017

Related U.S. Application Data

(60) Provisional application No. 62/251,538, filed on Nov. 5, 2015.

(51) Int. Cl.
*H02N 1/00* (2006.01)
*H02N 2/02* (2006.01)
(Continued)

(52) U.S. Cl.
CPC ........... *H02N 1/008* (2013.01); *B81B 3/0021* (2013.01); *B81B 3/0062* (2013.01);
(Continued)

(58) Field of Classification Search
CPC ...... H01L 41/09; H04N 5/23287; G02B 7/09; G02B 27/646; H02N 1/008; H02N 2/02
(Continued)

(56) References Cited

U.S. PATENT DOCUMENTS

| 5,536,988 A | 7/1996 | Zhang et al. |
| 7,420,318 B1 | 9/2008 | Pulskamp |

(Continued)

FOREIGN PATENT DOCUMENTS

| EP | 0253375 | 1/1988 |
| WO | 2014144863 A1 | 9/2014 |

(Continued)

OTHER PUBLICATIONS

Non-Final Office Action dated Jul. 20, 2017 in counterpart U.S. Appl. No. 15/412,679.
(Continued)

*Primary Examiner* — John K Kim
(74) *Attorney, Agent, or Firm* — Brian J. Colandreo; Michael T. Abramson; Holland & Knight LLP

(57) ABSTRACT

A package for moving a platform in six degrees of freedom, is provided. The platform may include an optoelectronic device mounted thereon. The package includes an in-plane actuator which may be a MEMS actuator and an out-of-plane actuator which may be formed of a piezoelectric element. The in-plane MEMS actuator may be mounted on the out-of-plane actuator mounted on a recess in a PCB. The in-plane MEMS actuator includes a plurality comb structures in which fingers of opposed combs overlap one another, i.e. extend past each other's ends. The out-of-plane actuator includes a central portion and a plurality of surrounding stages that are connected to the central portion. The in-plane MEMS actuator is coupled to the out-of-plane Z actuator to provide three degrees of freedom to the payload which may be an optoelectronic device included in the package.

4 Claims, 10 Drawing Sheets

(51) Int. Cl.
*H01L 41/09* (2006.01)
*H04N 5/232* (2006.01)
*G02B 7/09* (2006.01)
*G02B 27/64* (2006.01)
*B81B 3/00* (2006.01)
*B81B 7/00* (2006.01)
*B81B 7/02* (2006.01)

(52) U.S. Cl.
CPC ............ *B81B 7/0006* (2013.01); *B81B 7/008* (2013.01); *B81B 7/02* (2013.01); *G02B 7/09* (2013.01); *G02B 27/646* (2013.01); *H01L 41/09* (2013.01); *H01L 41/0953* (2013.01); *H02N 2/02* (2013.01); *H04N 5/23287* (2013.01); *B81B 2201/033* (2013.01); *B81B 2201/034* (2013.01); *B81B 2201/047* (2013.01); *B81B 2203/0118* (2013.01); *B81B 2203/0136* (2013.01); *B81B 2203/05* (2013.01); *B81B 2203/053* (2013.01)

(58) Field of Classification Search
USPC ........................................................ 310/309
See application file for complete search history.

(56) References Cited

U.S. PATENT DOCUMENTS

| | | | |
|---|---|---|---|
| 8,604,663 | B2 | 12/2013 | Gutierrez et al. |
| 10,033,303 | B2 * | 7/2018 | Liu .................... B81B 7/008 |
| 2005/0184351 | A1 | 8/2005 | Fu |
| 2008/0017942 | A1 * | 1/2008 | Kosaka ................ H04N 5/2257 257/432 |
| 2008/0198249 | A1 | 8/2008 | Tanimura et al. |
| 2012/0249462 | A1 | 10/2012 | Flanagan et al. |
| 2013/0001653 | A1 | 1/2013 | Milgrew et al. |
| 2013/0077945 | A1 * | 3/2013 | Liu .................... G02B 26/0841 396/55 |
| 2013/0279030 | A1 * | 10/2013 | Calvet .................... H02N 1/008 359/823 |
| 2015/0321900 | A1 | 11/2015 | Liu et al. |
| 2015/0334277 | A1 | 11/2015 | Liu et al. |
| 2015/0341534 | A1 | 11/2015 | Ng et al. |
| 2017/0133950 | A1 * | 5/2017 | Liu ........................ B81B 7/008 |
| 2017/0133951 | A1 | 5/2017 | Liu et al. |

FOREIGN PATENT DOCUMENTS

| | | |
|---|---|---|
| WO | 2015153017 A2 | 10/2015 |
| WO | WO 2015/153017 | 10/2015 |

OTHER PUBLICATIONS

Non-Final Office Action dated Nov. 8, 2017 in counterpart U.S. Appl. No. 15/412,679.

International Search Report and the Written Opinion of the International Searching Authority issued in related PCT Application Serial No. PCT/US2016/060115 dated Mar. 31, 2017.

* cited by examiner

MEMS ACTUATOR PACKAGE ARCHITECTURE

RELATED APPLICATIONS

This application is a regular application that claims priority to U. S. Provisional Application titled MEMS Actuator Architecture, filed Nov. 5, 2015 as Ser. No. 62/251,538, the contents of which are hereby incorporated by reference as if set forth in their entirety.

TECHNICAL FIELD

This disclosure relates to actuators in general, and in particular, to miniature actuators configured to move optoelectronic devices of various designs and in various packages.

BACKGROUND

Actuators are used to convert electronic signals into mechanical motion. In many applications such as, for example, portable devices, imaging related devices, telecommunications components, and medical instruments, it may be beneficial for miniature actuators to fit within the small size, low power, and cost constraints of the application.

Micro-electrical-mechanical system (MEMS) technology is the technology that in its most general form can be defined as miniaturized mechanical and electro-mechanical elements that are made using the techniques of microfabrication. The critical dimensions of MEMS devices can vary from well below one micron to several millimeters. In general, MEMS actuators are more compact than conventional actuators, and they consume less power.

In some applications, such as moving an image sensor in a camera for automatic focusing (AF) or optical image stabilization (OIS), an actuator is used to move an optoelectronic device that has a number of electrical inputs and outputs. For example, European patent No. EP 0253375, entitled "Two-Dimensional Piezoelectric Actuator," by Fukada et al., teaches a design for a two-dimensional actuator that can be used to move an image sensor in a plane. The actuator taught by Fukada, however, is large and unamenable to space-constrained applications. For example, Fukuda's actuator may be used in large, stand-alone digital cameras due to the associated space constraints of other, smaller devices.

Unlike conventional actuators, MEMS actuators may be used to, for example, move or position certain passive components within miniature cell phone cameras. By way of example, U.S. Pat. No. 8,604,663, entitled "Motion controlled actuator," and U.S. Patent Application Publication No. 2013/0077945 A1, entitled "Mems-Based Optical Image Stabilization," teaches MEMS actuators for moving a lens in a miniature camera (e.g., for use in a cell phone). However, neither of these MEMS actuators is able to move an optoelectronic device that has a number of electrical inputs and outputs. In addition, both of these MEMS actuators utilize deployment mechanisms that add complexity, size, and cost.

SUMMARY

The present disclosure is directed to actuators for moving or positioning a platform in multiple degrees of freedom. The position and orientation of a rigid body in space is defined by three components of translation and three components of rotation, and the present disclosure provides for an actuator assembly that provides six degrees of freedom. In various embodiments, the actuators include an electrostatic comb drive actuator for in-plane XY movement and a piezo-electrical "Z" actuator for out-of-plane movement. In various embodiments of the disclosure, a package includes two actuators including the comb drive actuator for in-plane XY movement being a MEMS actuator and referred to as the XY or "in-plane" MEMS actuator and the Z or "out-of-plane" actuator that provides for motion in multiple directions including the direction orthogonal to the XY plane. In summary, six degrees of freedom including rotational and translational motion, are provided by the combined actuators. In various package embodiments, the Z actuator is mounted on the bottom, the MEMS actuator is mounted on the top of Z actuator, and an optoelectronic device is mounted on the top of XY in-plane MEMS actuator, but other mounting and packaging arrangements are used in other embodiments. Actuators are used to position optoelectronic devices or other devices in cell phones or other optoelectronic or electronic devices. In other embodiments, the package includes only one actuator, the XY in-plane MEMS actuator.

In various embodiments, the XY in-plane actuator has four or an even number of comb drive sectors. In some embodiments, each comb drive has a rectangular or square shape, and motion control cantilevers that are disposed near the outer edge of the comb drive. In each comb drive sector, there is a pair of motion control flexures to enable or ensure that the fingers move in parallel. The even number comb drives may be positioned regularly around the center of the XY in-plane actuator, and the comb drive movements translate to the payload platform through a key cantilever flexure with negligible loss of motion. The payload platform to which the optoelectronic or other device is joined, may attach to any of various optoelectronic devices. In some embodiments, the mass of the optoelectronic device may be as high as 100 mg. In some embodiments of the XY in-plane actuator, one comb drive sector has a fixed comb, which may be glued or otherwise affixed to a fixed part, and a moving comb, which is connected to a long motion transfer cantilever.

In various embodiments, a long cantilever connects to the payload platform at one end and connects to the moving combs of the comb drive at the other end. The cantilever is designed to be more flexible in one translation and rotation degree of freedom, but stiff in other degrees of freedom to ensure the cantilever can isolate different motion modes such as to avoid interference between X and Y.

The disclosed actuators and actuator assemblies provide the advantage of being very flexible and robust. In some embodiments, one or more of the actuators include flexural or flexible, electrical connections As shown in US patent application, U.S. Ser. No. 14/677,730, the contents of which are herein incorporated by references as if set forth in their entirety, the buckled flexurized, i.e. flexural or flexible, electrical connection are used to enable flexibility. The actuator can be fabricated using commercially available or other standard or non-standard MEMS fabrication/processing technology and a MEMS process flow, including trench Deep Reactive Ion Etching (DRIE), oxidation, poly filling, metal deposition, DRIE and RIE release. The flexural electrical connections in the disclosure are not motion control flexures, so the connections are designed in to provide minimal stiffness while at the same time being electrically conductive. The flexible, electrical connections can move in the X, Y, and Z directions to achieve the XY and Z motion. In one example implementation, the flexible electrical connection's 3D view is illustrated. The connections are curved up and above the surface to which they are coupled, to achieve the required flexibility. In some embodiments, one end of the flexible electrical connection is connected to the moving portion of a device, and the other end is connected to the fixed portion of the device. The connection flexures are conductive. In some embodiments, the conductivity is provided by a metal alloy layer deposited on a silicon or other material surface. The flexible electrical connections may be formed of composite materials in various embodiments, and may include multiple layers as oxide, silicon, polysilicon, and metal.

In some embodiments, each comb drive sector of the XY in-plane actuator includes a pair of combs that includes a comb of fixed fingers, which are attached to the fixed spine, and a comb of moving fingers, which are attached to moving spines. In each finger pairs, the fingertips may have an overlap (see FIG. 5) such as but not limited to a 10-50 um overlap, to ensure a smooth force ramp up when electrical signal is applied.

In one embodiment, the MEMS in-plane XY mounts to Z out-of-plane actuator by gluing or otherwise affixing the center and the outer frame of the in-plane XY actuator to the Z out-of-plane actuator that is affixed to a circuit board such as a PCB or ceramic circuit board. The in-plane XY actuator may also be directly affixed to a circuit board in various embodiments such as embodiments in which the Z actuator is not utilized. The XY actuator may be mounted such that the outer frame and the fixed portion of the comb drive sectors are directly mounted to the circuit board. When the XY actuator mounts to Z actuator or the circuit board, the center fixed portion and outer frame fix to the same plane, so no offset is required during the assembly. It simplifies the assembly flow.

In each comb drive sector, there may be many pairs of combs. In some embodiments, one comb pair has a center spine, and fingers are attached to the spine from two side. Each side of the fingers moves the comb spine to their in-plane direction. The spine shape may vary in various embodiments and can be different and irregular. Various angles between the fingers and spine may be used. Electrical connections including the electrically conductive flexures, route from the finger comb to the moving platform, and then to fixed outer fixed bar through the traces on the surface and 3D flexible flexures. The different orientation finger combs are electrically separated by the insulation layer, which is deposited using the MEMS process. The separated X and Y in-plane movements of each sector are capable of achieving various different combinations of movement.

In one embodiment of the disclosure, a package includes a ceramic circuit board, a piezoelectric out-of-plane actuator, a MEMS in-plane actuator mounted over the piezoelectric out-of-plane actuator, an optoelectronic device mounted on the MEMS in-plane actuator, and a cover with window. In one embodiment, the out-of-plane Z actuator deforms to move the optoelectronic device translationally and rotationally out of the plane when the electrical signal is applied on the actuation beam. Further embodiments utilize different configurations of the MEMS electrostatic in-plane actuator and out-of-plane Z actuator which may be a piezoelectric actuator, to achieve additional motion. Various other miniature actuators may be used to achieve various types of motion with as many as six degrees of freedom.

Various embodiments of the piezoelectric out-of-plane Z actuator are disclosed. The disclosed packaging method ensures functionality in which the out-of-plane Z piezoelectric actuator moves the mass of the optoelectronic device and the moving mass of the in-plane actuator in an out of plane direction. The method reduces the payload requirement for the piezoelectric actuator, enabling greater flexibility to design the actuation beam and electrical connection flexures inside the actuator within a limited space. The two kinds of beams (actuation beam and electrical connection flexure beams) achieve the required flexibility at Z direction and high stiffness at the other directions.

In some embodiments, the piezoelectric out-of-plane Z actuator includes one or more center stages to attach the payload, an outer frame to fix the actuator, intermediate stages, one or more actuation beams, and electrical flexures. The intermediate stages can be multiple in number, and they function to connect actuation beams and electrical flexures at the same level together. The actuation beam and electrical connection flexure beams are designed to meet the stiffness requirements such as, for example, the travel direction requires a softer stiffness, but the other directions need to have much higher stiffness. The actuation beam and the electrical flexure number in each level might vary to achieve the force requirement and electrical connection requirements. The actuation beam deforms when the electrical signal is applied to the polarized PZT material to achieve needed deformation. The actuator shapes vary in various embodiments.

In another aspect of the disclosure, various electrical connection methods for the bottom piezoelectric out-of-plane Z actuator are disclosed. The out-of-plane Z actuator may include electrical connections through holes in the in-plane MEMS actuator in some embodiments. Conductive epoxy, silver paste, or electrical plating copper in the holes can electrically connect the piezoelectric out-of-plane Z actuator to the in-plane MEMS actuator, but other conductive connection methods are used in other embodiments.

Another aspect of the disclosure provides the overall package assembly flow sequence. The packaging sequence provides a method to assembly the two actuators into a package according to various embodiments. The package method achieves the requirements in the mechanical and electrical aspects.

BRIEF DESCRIPTION OF THE DRAWINGS

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

The figures are provided for purposes of illustration only and merely depict typical or example embodiments of the disclosure. The figures are described in greater detail in the Detailed Description and the examples below to facilitate the reader's understanding of the disclosed technology, and are not intended to be exhaustive or to limit the disclosure to the precise form disclosed. It should be understood that the disclosure may be practiced with modification or alteration, and that such modifications and alterations are covered by one or more of the claims, and that the disclosure may be limited only by the claims and the equivalents thereof. For clarity and ease of illustration, these drawings are not necessarily made to scale.

DETAILED DESCRIPTION

The present disclosure is directed to various embodiments of systems, methods, and apparatuses for moving, i.e. actuating, a platform having electrical connections, and includes packaging of the same. The details of some example embodiments of the systems, methods, and apparatuses of the present disclosure are set forth in the description below. Other features, objects, and advantages of the disclosure will be apparent to one of skill in the art upon examination of the present description, figures, examples, and claims. It is intended that all such additional systems, methods, apparatus, features, and advantages, etc., including modifications thereto, be included within this description, be within the scope of the present disclosure, and be protected by one or more of the accompanying claims.

In accordance with embodiments further described herein, the actuators, including the packaging thereof, may be used in a range of different devices and environments, for example, in portable electronic devices, miniature cameras, optical telecommunications components, and medical instruments. The actuators serve to position the optoelectronic devices in their environment. The features of the disclosed actuators generally allow for a high degree of precision in moving or positioning a platform in multiple degrees of freedom within these various environments, while achieving low power consumption and being highly compact with minimum space penalty.

Figure 1:
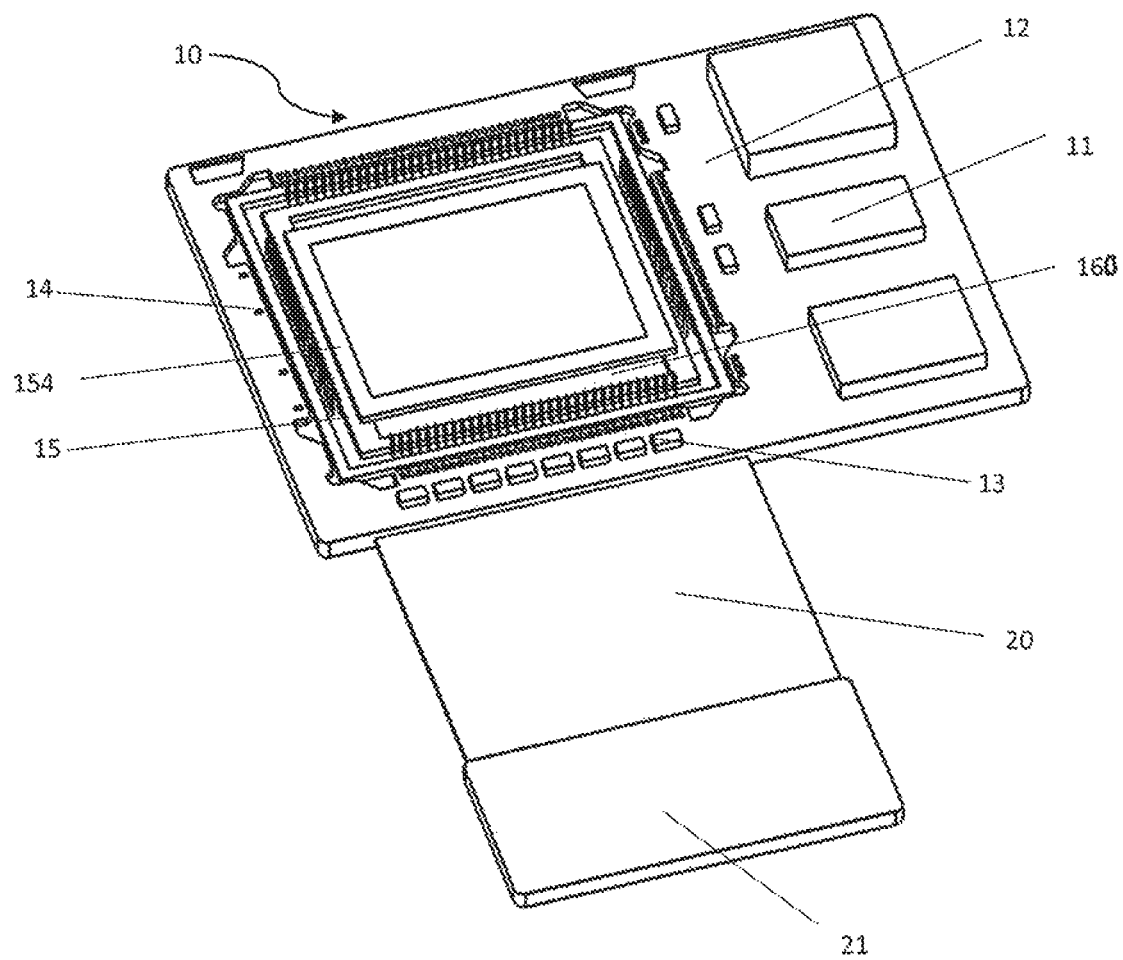
FIG. 1 is a perspective view of a package without cover in accordance with various embodiments of the present disclosure.

Referring now to the drawings, FIG. 1 illustrates a 3D perspective view of a package 10 shown without a cover, in accordance with various embodiments of the present disclosure. Package 10 includes a ceramic or regular circuit board 12, contact pads 14, drivers 11, electronic components 13, flexible circuit 20, connector 21, in-plane actuator package 15 including an in-plane MEMS actuator, optoelectronic device 154, and out-of-plane actuator 160, which is disposed under the in-plane actuator 15. Circuit board 12 may be a printed circuit board, PCB, in some embodiments. Optoelectronic device 154 may be an image sensor, lens or display or other devices, in various embodiments. Electronic components 13 may represent any of various electronic or semiconductor components and devices. Flexible circuit 20 may be a flexible circuit board or other flexible circuit and connector 21 provides connection between the components of package 10 and the outside world.

The two actuators are compactly packed inside a recess in the circuit board to ensure minimum space penalty in various embodiments. The opening or recess in circuit board 12 may have various depths in various embodiments and in some embodiments, epoxy is used to join the actuators to the circuit board 12. In some embodiments, the described components may be joined to a top surface of the circuit board using various epoxies and other adhesives. There are contact pads on the outer frame of MEMS actuator, i.e. in-plane MEMS actuator 150 and on the circuit board 12 there are contact pads as well. Contact pads 14 on the circuit board may correspond to pads on the MEMS in-plane actuator package 15. The in-plane actuator package 15 may be an electrostatic comb drive actuator as will be described below, and the out-of-plane actuator 160 may be a piezoelectric actuator but other types of actuators and other actuator arrangements are used in other embodiments. The two actuators may be assembled in the package 10. In some embodiments, out-of-plane actuator 160, and in-plane actuator package 15 are fabricated at the same time using MEMS processing operations, i.e. using the same sequence of processing operations, to save cost in long-term development. The illustrated embodiment shows two actuators—in-plane actuator package 15 and out-of-plane actuator 160, but additional numbers of actuators may be used in other embodiments and other components may be included at various locations in the assembled package.

Figure 2A:
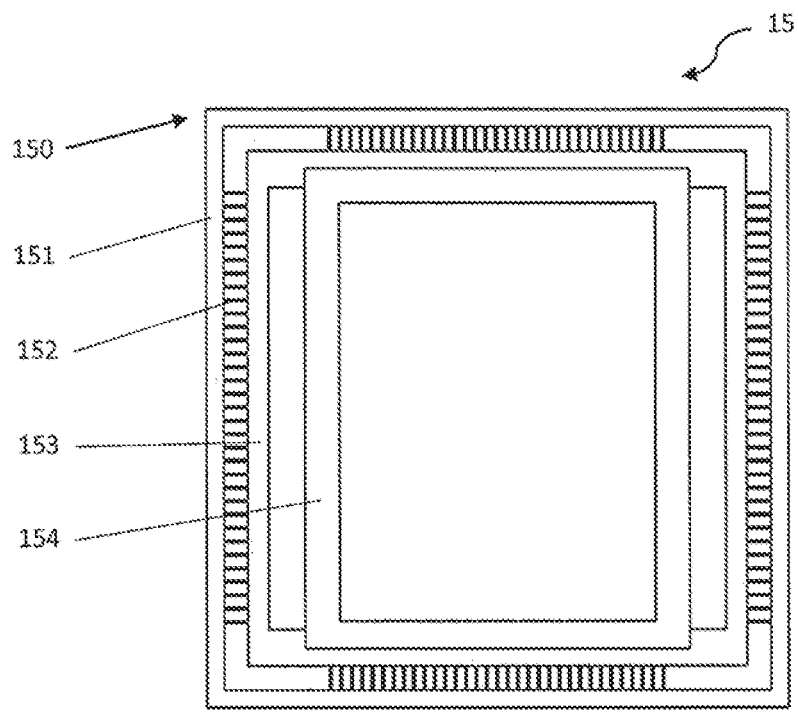
FIG. 2A is a plan view of an in-plane actuator with the optoelectronic device in accordance with various embodiments of the present disclosure.

As shown in FIG. 2A, the in-plane actuator package 15 includes an attached optoelectronic device 154 and an in-plane MEMS actuator 150. The in-plane MEMS actuator 150 includes outer frame 151, flexural electrical connections 152, platform 153 for attaching payload, an attached optoelectronic device 154, and actuation sectors (comb drive sectors 155, which will be shown in FIG. 3). The optoelectronic device 154 is affixed to platform 153 of in-plane MEMS actuator 150 by glue, or various other adhesive or other materials and bonding methods such as eutectic bonding. Various glues and epoxies may be used. In other embodiments, other devices may be actuated and coupled to platform 153 of in-plane MEMS actuator 150.

Figure 2B:
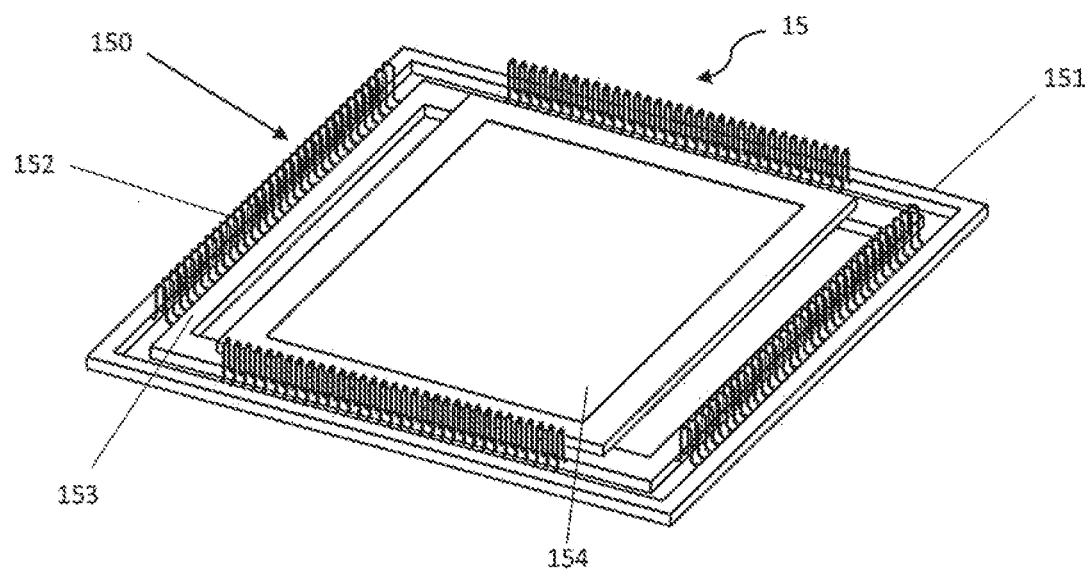
FIG. 2B is a perspective view of an in-plane actuator with the optoelectronic device in accordance with various embodiments of the present disclosure.

As shown in FIG. 2B, the flexural, i.e. flexible electrical connections 152 of in-plane MEMS actuator 150 are curved up and bucked to achieve the needed flexibility. In the illustrated embodiment, flexible electrical connections 152 have one end attached to the platform 153, the moving portion and the other end to attach to the outer frame 151, the fixed portion. Flexible electrical connections 152 are conductive wires that extend above the plane, i.e. an upper surface of, in-plane MEMS actuator 150 and conductively couple laterally separated components of in-plane MEMS actuator 150. The flexible electrical connections 152 communicate the electrical signal from the optoelectronic device 154 and the actuation area of in-plane MEMS actuator 150, to the outside circuit board 12. The outer frame 151 may be affixed to the circuit board 12 (shown in FIG. 1) using epoxy or various other suitable materials or devices.

Figure 3:
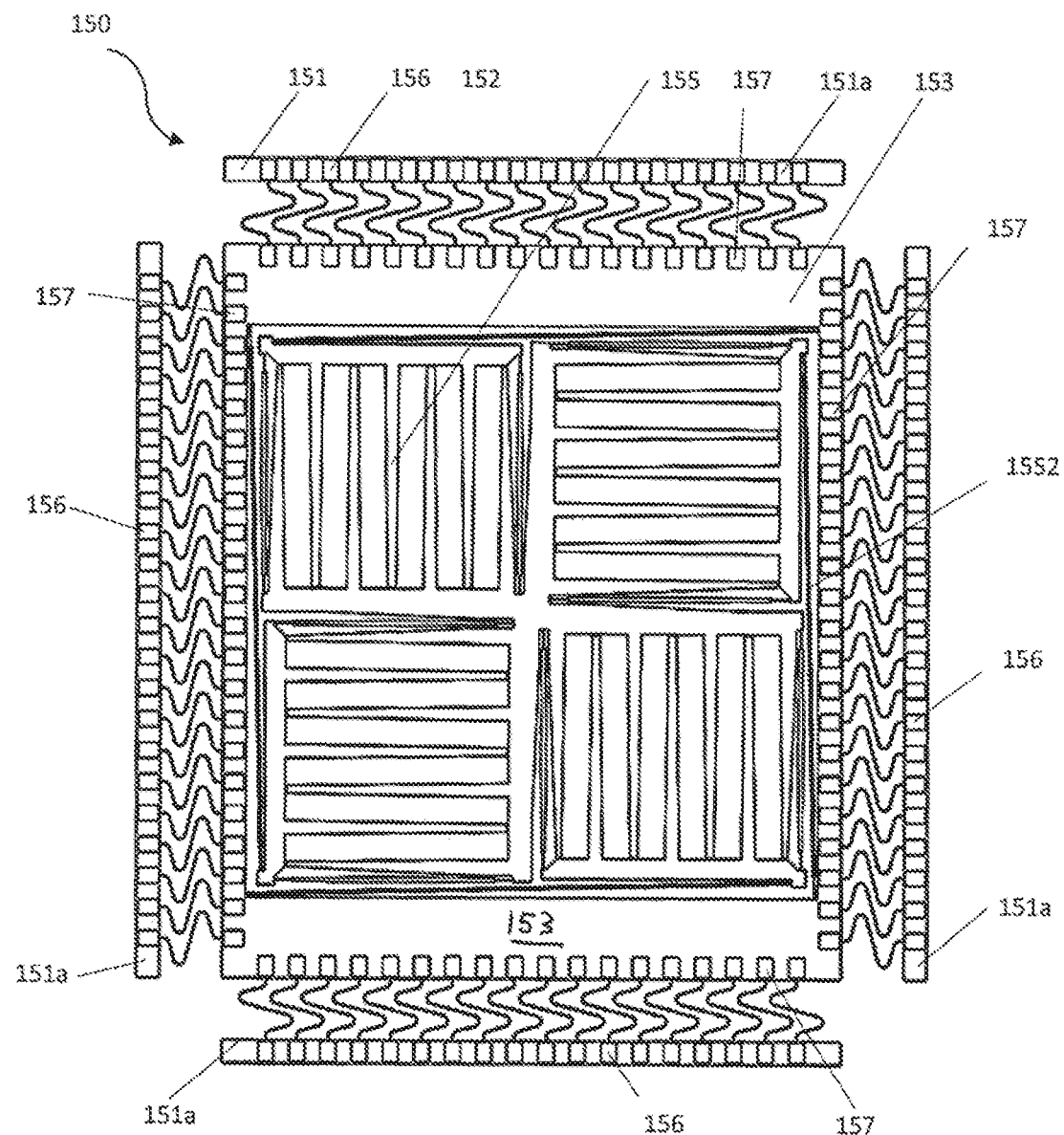
FIG. 3 is a top view of an in-plane actuator in accordance with various embodiments of the present disclosure.

FIG. 3 a top view of an in-plane actuator in accordance with various embodiments of the disclosure. FIG. 3 shows more details of the in-plane MEMS actuator 150. Outer frame 151 include 4 bars 151*a* that are illustrated as being spaced apart to show detail, but bars 151*a* are latched or otherwise joined together to become an outer frame 151 in various embodiments, such as shown in FIG. 2. In other embodiments, bars 151*a* are not joined together. On outer frame 151, there are number of contact pads 156, which connect to one end of the flexible electrical connection 152. Platform 153 includes a number of contact pads 157, which are also connected to the other end of the flexible electrical connection 152. Contact pads on the optoelectronic device 154 (not shown in FIG. 3) may be coupled to corresponding pad 157 by a traditional COB method, conductive epoxy, silver paste, or MEMS bonding method, but other suitable bonding methods are used in other embodiments.

As shown in FIG. 3, the comb drive sectors 155 are actuation sectors disposed inside platform 153. Comb drive sectors 155 are disposed in the same plane and surrounded laterally by platform 153. In-plane MEMS actuator 150 includes multiple comb drive sectors 155. Each comb drive sectors 155 includes moving and fixed portions and is coupled to cantilever 1552 which is further connected to platform 153. There are 4 comb drive sectors 155 inside platform 153 illustrated in FIG. 3, but other numbers of comb drive sectors are used in other embodiments. The comb drive sectors 155 regularly located around the center of the MEMS actuator 150 in the illustrated embodiment. The shape of comb drive sensor 155 may advantageously be rectangular. Other arrangements and shapes may be used in other embodiments. The curved shape of the flexible electrical connections 152 shown in FIG. 3 is provided for illustration and provides a sample shape but various other shapes of electrical connections 152 are used in other embodiments. As shown in FIG. 3, each comb drive sector 155 connects to one long cantilever 1552 to translate the movement from comb finger movement to the platform movement by way of cantilever 1552. Cantilevers 1552 have one end attached to platform 153 and the other end attached to comb drive sector 155 to translate the movement from comb drive sector 155 to platform 153 to which the optoelectronic device is joined. There are corresponding number of cantilevers 1552 and comb drive sectors 155 in various embodiments. Cantilevers 1552 may be therefore referred to as motion transfer cantilevers 1552.

Figure 4:
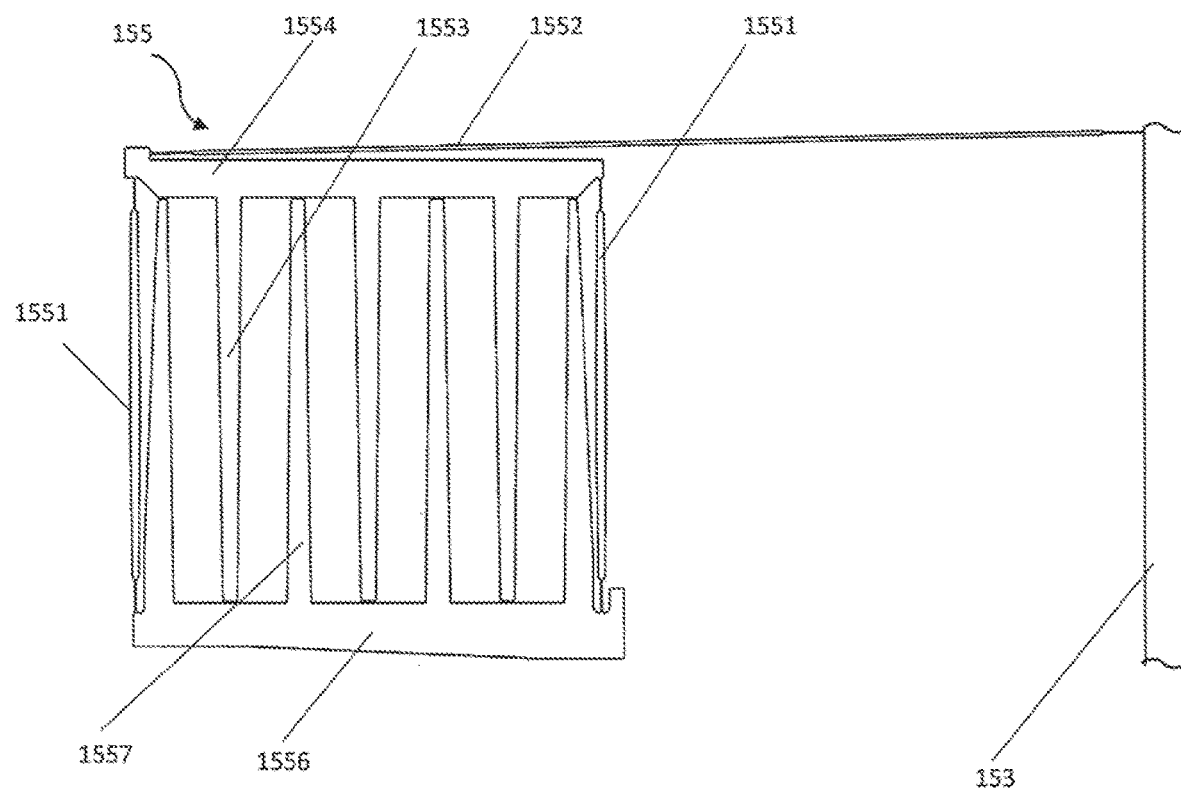
FIG. 4 is a top view of a comb drive sector in accordance with various embodiments of the present disclosure.
Figure 5:
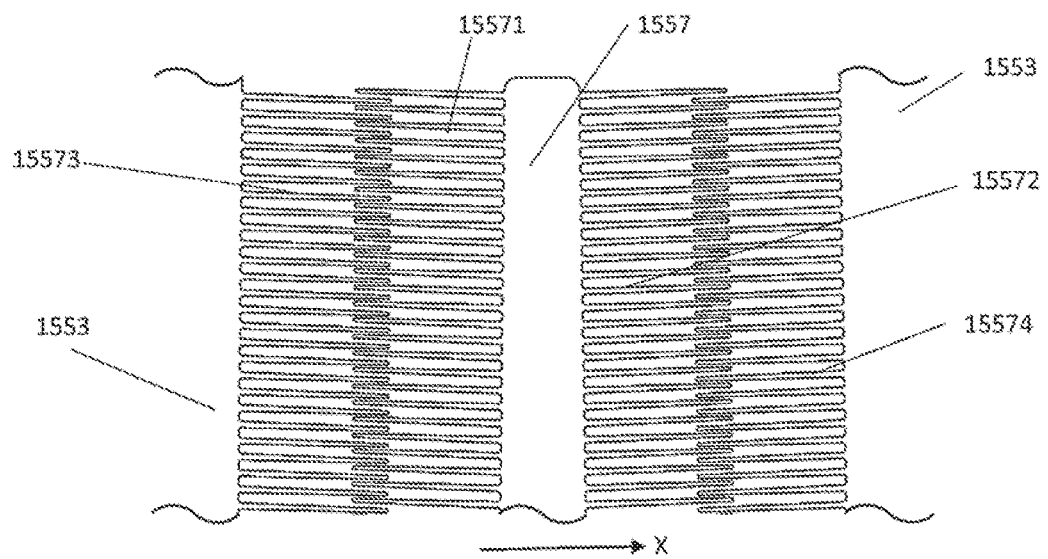
FIG. 5 is a plan view of a comb pair in accordance with various embodiments of the present disclosure.
Figure 6:
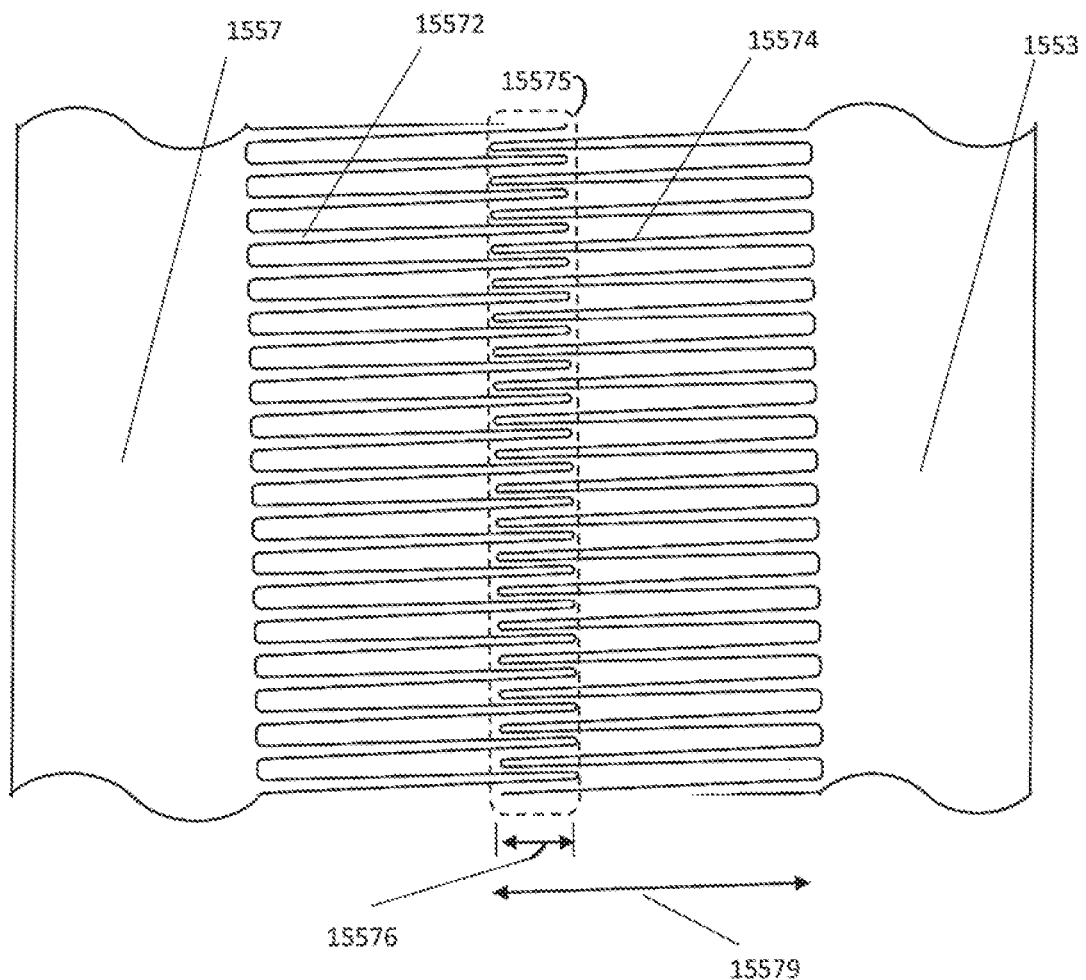
FIG. 6 is a plan view of fingers of a comb pair in accordance with various embodiments of the present disclosure.

FIG. 4 illustrates a top view of aspects of a comb drive sector 155 in accordance with various embodiments of the present disclosure. Each comb drive sector 155 includes motion control cantilever 1551 disposed outside of the comb drive, moving frame 1554, moving spines 1553, fixed spines 1557, fixed frame 1556, which may be affixed to the circuit board when assembled, and a long motion transfer cantilever 1552 connected to the moving frame 1554 at one end and to the moving platform 153 at the other end. Comb drive sector 155 includes a fixed member including fixed frame 1556 and multiple fixed spines 1557 that are orthogonal to fixed frame 1556 and a moveable member that includes a moveable frame 1554 and multiple moveable spines 1553 that are orthogonal to moveable frame 1554. The motion transfer cantilever 1552 is more flexible in one translation and rotation degree of freedom, but very stiff in other degrees of freedom, to ensure the cantilever 1552 can isolate different motion modes, i.e. move in a desired direction to prevent any interference between X and Y. Both moving spine 1553 and fixed spine 1557 have many fingers attached to achieve the required movements, as are shown in FIGS. 5 and 6. Various numbers of fingers may be associated with, i.e. coupled to each of moving spine 1553 and fixed spine 1557. In various embodiments, each comb drive sector 155 includes two motion control cantilevers 1551, separately placed at two sides of the comb drive sector 155. Each cantilever 1551 has one end attached to the moving frame 1554 and the other end attached to the fixed frame 1556 in various embodiments. This arrangement advantageously enables the comb fingers move in parallel direction with minimum arcuate motion.

FIG. 5 illustrates a plan view of a comb pair of a comb drive sector 155 in accordance with various embodiments of the present disclosure. Each comb pair of the comb drive sector includes two rows of moving fingers and two rows of fixed fingers. As shown in FIG. 5, the fixed spine 1557 attached to a row of fingers 15571 at one side and a row of fingers 15572 at other side. Fingers 15571 and 15572 are fixed fingers. Moving spine 1553 has one row of fingers 15573 to pair with fixed finger row 15571 and one row of fingers 15574 to pair with fixed finger row 15572. Fingers 15573 and 15574 are movable fingers. Fingers 15571, 15572, 15573 and 15574, or at least the center axes of fingers 15571, 15572, 15573 and 15574 are all parallel one another and generally orthogonal to the respective spines to which they are coupled but other arrangements and various angles are used in other embodiments. In some embodiments, the fingers have the same width throughout their length and in some embodiments, the fingers are tapered. According to some arrangements, each finger of finger pair 15573 moves in parallel in the +X direction when the electrical signal is applied; and each finger of finger pair 15574 moves in parallel to −X direction when the electrical signal is applied.

Fingers 15571, 15572, 15573 and 15574 may be alternatively referred to as teeth of the comb structures.

FIG. 6 illustrates a plan view of a finger pair in accordance with some embodiments of the present disclosure. Fixed spines 1557 are parallel to moveable spines 1553. The pair of fingers 15572 and 15574 overlap in overlap region 15575, by distance 15576 which may be about 10-50 microns in some embodiments but other distances may be used in other embodiments. The overlap region 15575 represents the distance 15576 that the end of fingers 15572 extends past the ends of fingers 15574, as illustrated. Fingers 15572 and 15574 are in the same plane. The ends of fingers 15572 and the ends of fingers 15574 form overlap region 15575 in which adjacent ends of fingers 15572 are interposed between adjacent ends fingers 15574. Overlap region 15575 include first fingers 15572 and second fingers 15574 arranged such that their respective ends are arranged in an alternating sequence. In some embodiments, the fingers are tapered such that their tips are narrower than at the location where the fingers are joined to moving spine 1553 or fixed spine 1557. Various degrees of taper may be used. The overlap of the fingers provided by overlap region 15575 ensures enough initial actuation force when electrical voltage or charge ramps up, so the actuator can move gradually without sudden jump on the plot of travel versus voltage. The finger height may be determined by various aspects of the MEMS fabrication process and various design aspects. Various finger lengths 15579, finger gap overlap 15575 distances 15576, finger gaps (space between adjacent fingers), and finger taper angles are used in various embodiments and may be determined by various design factors, application considerations and manufacturability considerations. The finger length 15579, finger gap overlap 15575 distance 15576, finger gap (the gap between adjacent fingers), and finger taper angle are optimized to achieve the required travel in the limited voltage range. In some embodiments, each of the fingers attached to a respective spine, such as fingers 15574 attached to moving spine 1553, has the same length 15579 and arranged in parallel together form a rectangular shape.

Figure 7A:
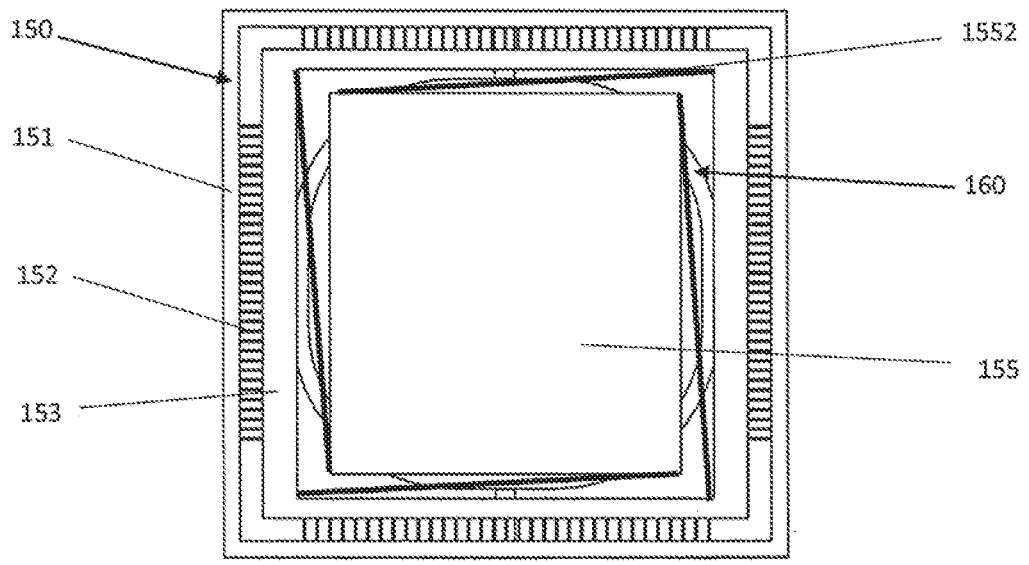
FIG. 7A is a 2D top view of a combination of in-plane actuator and out-of-plane actuator in accordance with various embodiments of the present disclosure.
Figure 7B:
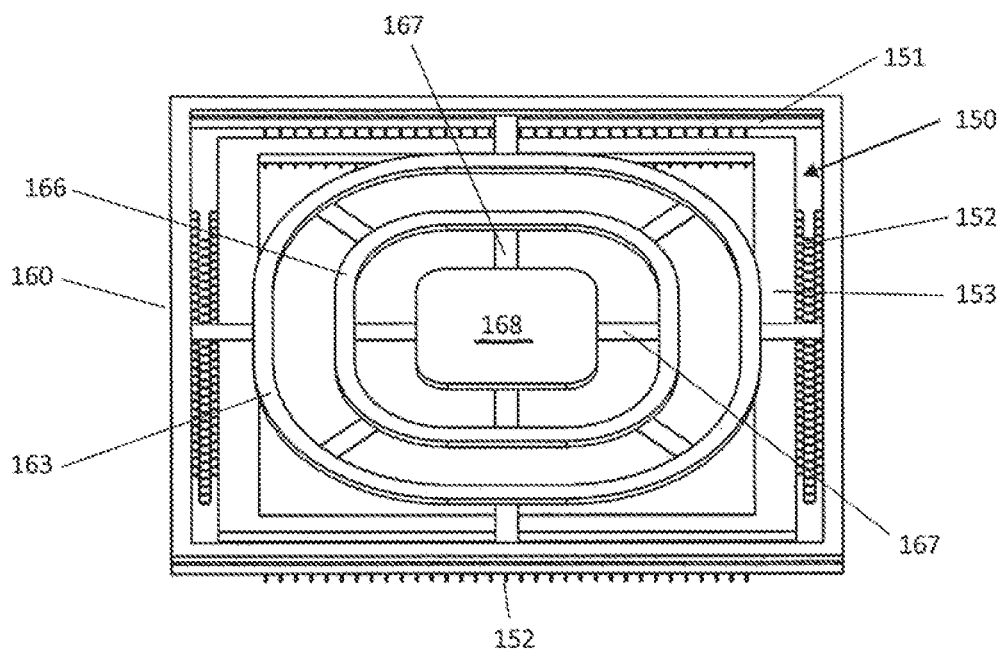
FIG. 7B is a perspective back view of a combination of in-plane actuator and out-of-plane actuator such as shown in FIG. 7A, in accordance with various embodiments of the present disclosure.

FIGS. 7A and 7B illustrate top and bottom views, respectively, of an embodiment of a combination of in-plane actuator and out-of-plane actuator in accordance with various embodiments of the present disclosure. The in-plane MEMS actuator 150 and out-of-plane actuator 160 attach together on the center of comb drive sectors 155 of in-plane MEMS actuator 150 and also at outer frame 151 of in-plane MEMS actuator 150. In the center portion, center stage 168 of out-of-plane actuator 160 is attached to comb drive sectors 155 (shown previously in more detail) of in-plane MEMS actuator 150. Cantilever 1552 is as described above. Due to out-of-plane actuator 160 being radially stiff and the bonding at the center of out-of-plane actuator 160 to comb drive sectors 155, out-of-plane actuator 160 cannot generate or provide in-plane movement when the in-plane actuator 150 is moving in plane. Actuator 150 is very stiff and resistant to movement in the out-of-plane direction in various embodiments. As such, in-plane actuator 150 cannot provide any movement out of plane when the out-of-plane actuator 160 is moving.

As shown in FIGS. 7A and 7B, the flexible electrical connections 152 in this embodiment conduct the electrical signal within the actuator 150 and also provide electrical signal routing to the out-of-plane actuator 160 in various embodiments. The flexible electrical connections 152 may be designed in a way that the stiffness is very low and the flexible electrical connections 152 include high electrical conductivity so as to conductively couple electrical components. Flexible electrical connections 152 can move at X, Y, and Z directions to achieve the XY and Z actuator's requirement. The flexible electrical connection 152 is curved up to achieve the required flexibility as shown in FIG. 2B. The flexible electrical connections 152 have high conductivity. In various embodiments, flexible electrical connection 152 are formed of a metal alloy layer disposed on a polysilicon, silicon oxide, silicon or other suitable semiconductor surface. The material of the flexible electrical connections 152 may be a composite material, and may include multiple layers including but not limited to oxide, silicon, polysilicon, aluminum, copper, and metal.

Figure 8:
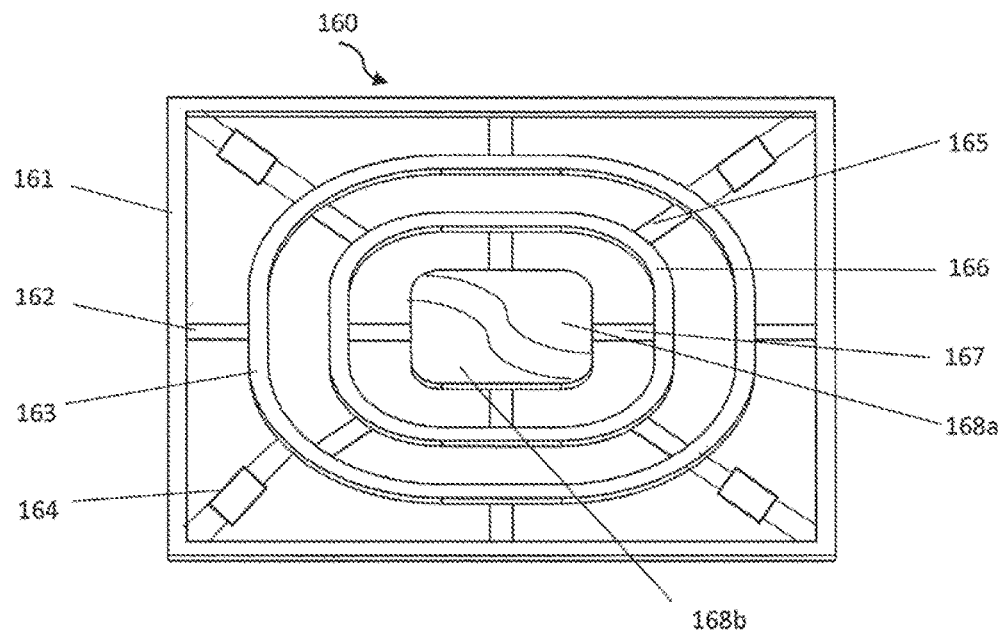
FIG. 8 illustrates an out-of-plane actuator in accordance with various embodiments of the present disclosure.

FIG. 8 illustrates a perspective, top view of an out-of-plane actuator 160 in accordance with various embodiments of the present disclosure. The out-of-plane actuator 160 is a piezoelectric actuator in some embodiments but other actuators are used in other embodiments. The out-of-plane actuator 160 provides actuation in multiple directions including the direction orthogonal to the plane of out-of-plane actuator 160, i.e. in the Z direction relative to the XY plane of out-of-plane actuator 160. The out-of-plane actuator 160 includes a center stage 168 to attach the payload, i.e. the optoelectronic or other optical or electronic device being actuated. Out-of-plane actuator 160 also includes outer frame 161 to fix the actuator, intermediate stages 163 and 166, actuation beams 162, 165, and 167, and electrical flexures 164. Center stage 168 is oval in the illustrated embodiment but other shapes are used in other embodiments. Actuation beams 162, 165, and 167 couple center stage 168, intermediate stages 163 and 166, and outer frame 161. Various arrangements and configurations may be used. Center stage 168 may be advantageously concentrically surrounded by evenly spaced-apart intermediate stages 163 and 166 as in the illustrated embodiment but other arrangements are used in other embodiments. Intermediate stages 163 and 166 can be more or less as shown, i.e. have a generally annular or elliptical shape, but may take on other shapes in other embodiments and intermediate stages 163 and 166 function to connect components at the same level as actuation beams 162 and electrical flexures 164. The Z, out-of-plane movement of center stage 168 of out-of-plane Z actuator 160 is generated due to the deformation of the actuation beams 162, 165, and 167, which may be formed of piezoelectric ("PZT") or other suitable material such as deflects in response to an electrical signal. The actuation beam 162 and electrical flexure 164 may be advantageously designed to meet various stiffness requirement. They may advantageously be soft, i.e. flexible or otherwise deformable in the travel direction (Z direction) and very stiff at other directions. Each actuation section may include various numbers of actuation beams 162 and electrical flexures 164. The number of actuation beams 162 and the electrical flexures 164 at each level might vary to achieve the force requirement and electrical connection requirements. The actuation beam 162, 165, and 167 includes cantilevers or hinges to enable movement in the out of plane direction. PZT material may be used to achieve the desired deformation when an electrical signal is applied. Support beams such as actuation beam 162 and electrical flexure 164 may include a metal layer for electrical routing. The electrical flexures 164 may include cantilevers or hinges and metal layers in various embodiments. The electrical flexure 164 may be disposed between intermediate stages 163 and 166 and/or between intermediate stage 166 and center stage 168 in various embodiments.

As shown in FIG. 8, the center stage 168 might be separated into two or more discrete pieces a such as center stage portions 168a and 168b, in various embodiments. This may also be true for intermediate stages 163 and 166. When the electrical signal is applied on the actuation beams connected to one portion 168a or 168b of the separated stage 168, this portion of center stage 168 will move out of plane to achieve the roll or pitch. In some embodiments, out-of-plane actuator 160 includes two separately moveable center stage portions 168a and 168b, intermediate stages 163, 166 surrounding the center stage pieces and actuation beams 162, 165, 167 connecting at least one of the center stage portions 168a and 168b to intermediate stages, 163, 166. The actuation beams 162, 165, 167 are deformable and provide out of plane movement to center stage portions 168a, 168b. Portions 168a and 168b may be separately moveable due to the deformation of the associated actuation beam 162, 165, or 167. In other embodiments, out-of-plane actuator 160 includes more than two separately moveable center stage portions. The shapes of the separately moveable center stage portion vary in various embodiments.

Figure 9A:
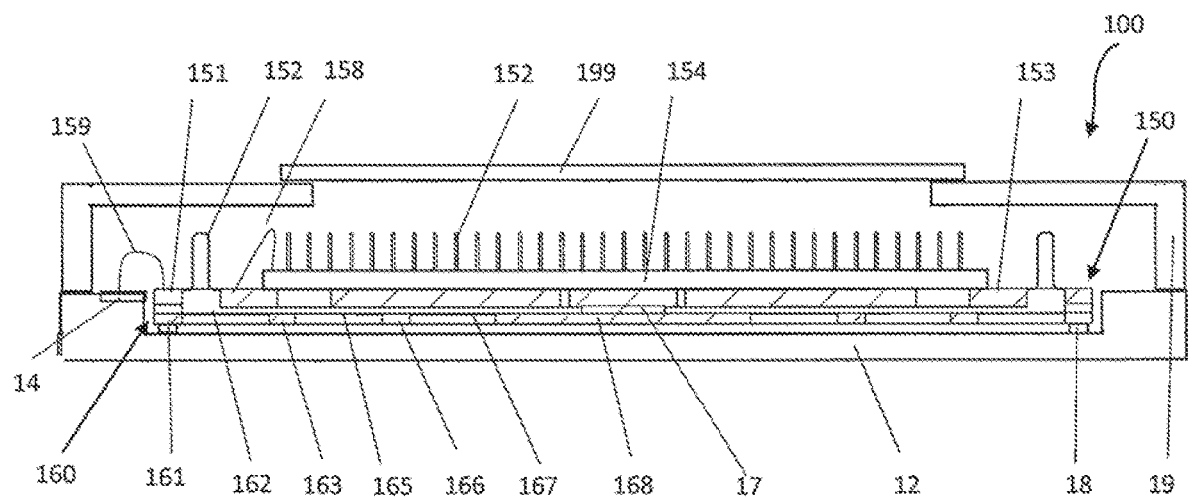
FIG. 9A is a cross-sectional view of a two-actuator package in accordance with various embodiments of the present disclosure.

FIG. 9A illustrates a cross-sectional view of a two-actuator package in accordance with various embodiments of the present disclosure. The out-of-plane actuator 160 is joined to circuit board 12 at outer frame 161 by epoxy 18 or other suitable adhesive or other coupling means. Circuit board 12 forms part of package 100 in various embodiments. In-plane MEMS actuator 150 is disposed on the out-of-plane Z-direction actuator 160 and bonds to outer frame 161 and center stage 168 of out-of-plane actuator 160. The optoelectronic device 154 is disposed on the top of the in-plane actuator 150. The holder 19 with a glass window 199 is disposed on the top of the circuit board 12. Electrical connection 158 from optoelectronic device 154 to platform 153 of MEMS in-plane actuator 150 may be achieved by standard COB wire bonding process, by conductive epoxy or paste, or by the MEMS bonding process or by other suitable bonding means. Electrical connection 159 from outer frame 151 of MEMS in-plane actuator 150 to pads 14 of PCB 12 may advantageously use the same process as the standard COB wire bonding process in various embodiments. FIG. 9A illustrates the combination of in-plane actuator 160 and out-of-plane actuator 150 and other components of package 100. In various other embodiments, out-of-plane actuator 160 is not used. In such embodiments, in-plane actuator 150 may be directly mounted to circuit board 12 which may be a PCB or ceramic circuit board, by gluing or otherwise affixing the fixed comb drive frame 1556 of the comb drive sector 155 (see FIG. 4) and the outer frame 151 to circuit board 12. The comb drive frame 1556 and the outer frame 151 may directly mount to the circuit board without any out-of-plane offset in some embodiments.

Figure 9B:
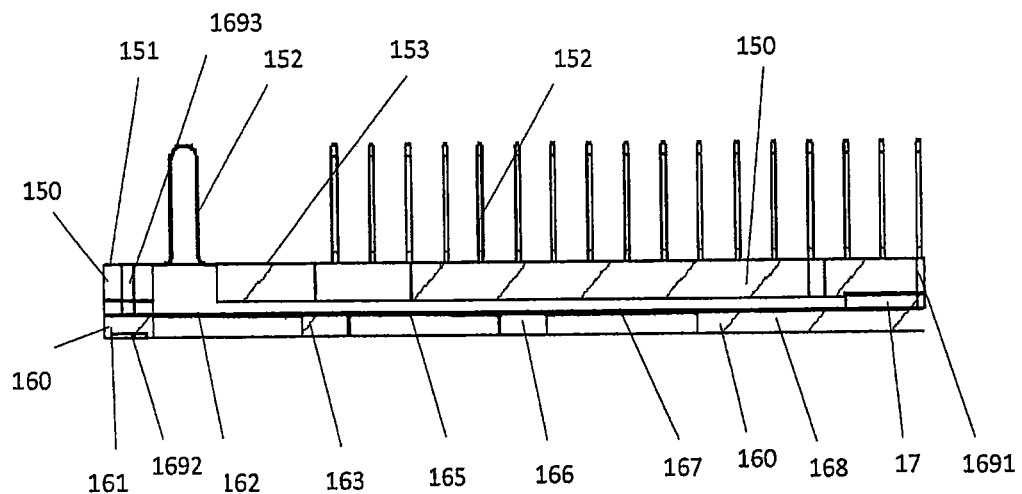
FIG. 9B is a zoom-in cross-sectional view of a two-actuator package in accordance with various embodiments of the present disclosure.

FIGS. 9A and 9B show that out-of-plane actuator 160 may be electrically coupled to components outside of package 100 through conductive epoxy or paste disposed in holes 1691 and 1693 formed in in-plane MEMS actuator 150 and also through flexible electrical connections 152 of in-plane MEMS actuator 150.

FIG. 9B illustrates a zoom-in cross-sectional view of portions of a two-actuator package in accordance with various embodiments of the disclosure. In various embodiments, the electrical routes/signals of the out-of-plane actuator 160 can go through the electrical flexures 164 (see FIG. 8), or go through the actuation beam 162, 165, and 167, and through contact 1692 to contact the circuit board 12 (not shown in FIG. 9B). Electrical signals may also pass through the in-plane actuator 150 through filled holes 1691 and 1693. Conductive epoxy, silver paste, or electrical plating can fill or coat the holes 1691, 1693, to achieve the conduction. The electrical signal will go from the out-of-plane actuator 160 to outside, through the flexible electrical connections 152.

Figure 10:
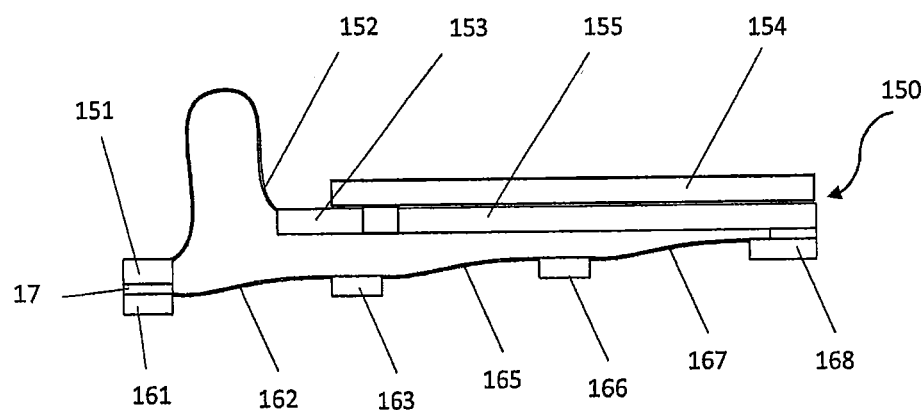
FIG. 10 is a cross-sectional view of an deformed out-of-plane Z actuator with the in-plane actuator in accordance with various embodiments of the present disclosure.

FIG. 10 illustrates a cross-sectional view of portion of a deformed out-of-plane "Z" actuator 160 and in-plane actuator 150, in accordance with various embodiments of the present disclosure. The deformed out-of-plane Z actuator 160 moves the optoelectronic device 154 coupled to in plane actuator 150 and at least to center stage 168 of out of the plane of out-of-plane "Z" actuator 160, when the electrical signal is applied on the actuation beams 162, 165, and 167. The disclosed package ensures the out-of-plane Z actuator 160 is capable of moving the mass of the optoelectronic device 154 and moveable mass of the in-plane actuator. In some embodiments, the out-of-plane Z actuator 160 is a piezoelectric actuator. The disclosed actuator arrangement reduces the payload requirement for the piezoelectric actuator (out-of-plane Z actuator 160), and enables greater flexibility in the design of the actuation beam and electrical connection flexures inside the actuator. The aforementioned beams are designed in combination to achieve the required flexibility at Z direction and stiffness, i.e. resistance to motion, in the other directions. The shapes of the various components of actuator will vary in various embodiments.

As shown in FIG. 10, the flexibility of flexible electrical connection 152 enables the desired movement of various portions of in-plane actuator 150 with respect to one another, and also achieves the flexibility and robustness requirement for the out-of-plane Z actuator 160. The flexible electrical connection 152 advantageously moves in all translational degrees of freedom. The two actuators—in-plane actuator 150 and out-of-plane Z actuator 160 bond together at the center stage 168 and the outer frame 161 in various embodiments but other bonding sites may also be used such as epoxy or other bonding material 17.

The Z, out-of-plane movement of out-of-plane actuator 160 is generated at least in part due to the deformation of the actuation beam 162, 165, and 167. As shown more clearly in the expanded view of FIG. 11A, the actuation beam 162 deforms when the electrical signal is applied to the polarized piezoelectric (PZT) material. Various suitable PZT materials with different polarization pattern and characteristics may be used to achieve the deformation, in various embodiments. Actuation beams 165 and 167 deform similarly to actuation beam 162 but are not shown in FIG. 11A. In some embodiments, the actuation beam 162 is a composite material such as formed of upper material 1622 and lower material 1621, in which various materials may be used in combination to produce the desired piezoelectric effect. Various suitable materials may be used. Actuation beam 162 will be sufficiently flexible to achieve various stiffness and flexibility requirements.

Figure 11A:
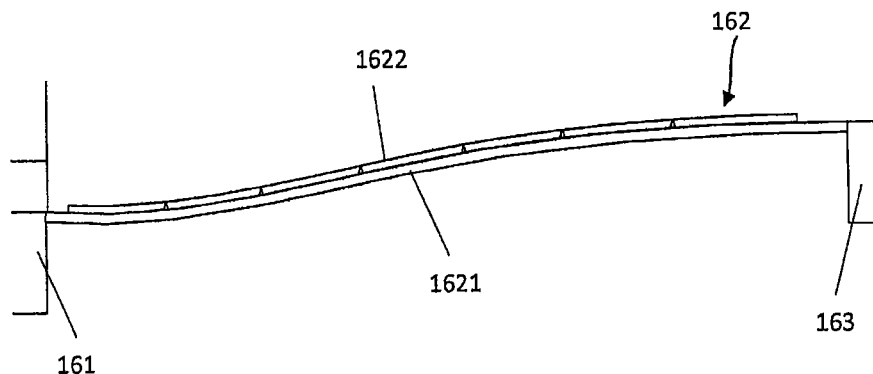
FIGS. 11A and 11B illustrate a cross-sectional view, and a top view, respectively, of an actuation beam of the piezoelectric actuator in accordance with various embodiments of the present disclosure.
Figure 11B:
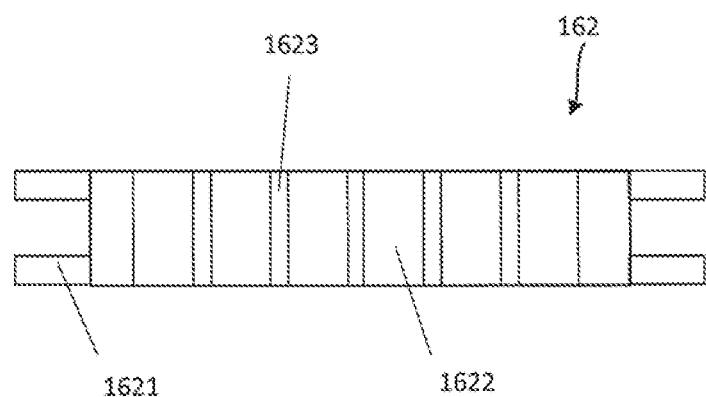

FIG. 11B shows a top view of the actuation beam 162 which is a composite material. Upper material 1622 is disposed over lower material 1621. FIGS. 11A and 11B show that in some areas lower material 1621 is covered by upper material 1622 and other portions 1623 of lower material 1621 are void of upper materials 1622. Upper material 1622 is therefore a discontinuous layer whereas lower material 1621 is a continuous layer. Various materials may be used in various arrangements to produce the desired piezoelectric effect.

Further embodiments may utilize different configurations of the MEMS electrostatic actuator and piezoelectric actuator to achieve additional degrees of freedom. Other miniature actuator might be used to achieve the degrees of freedom.

Figure 12:
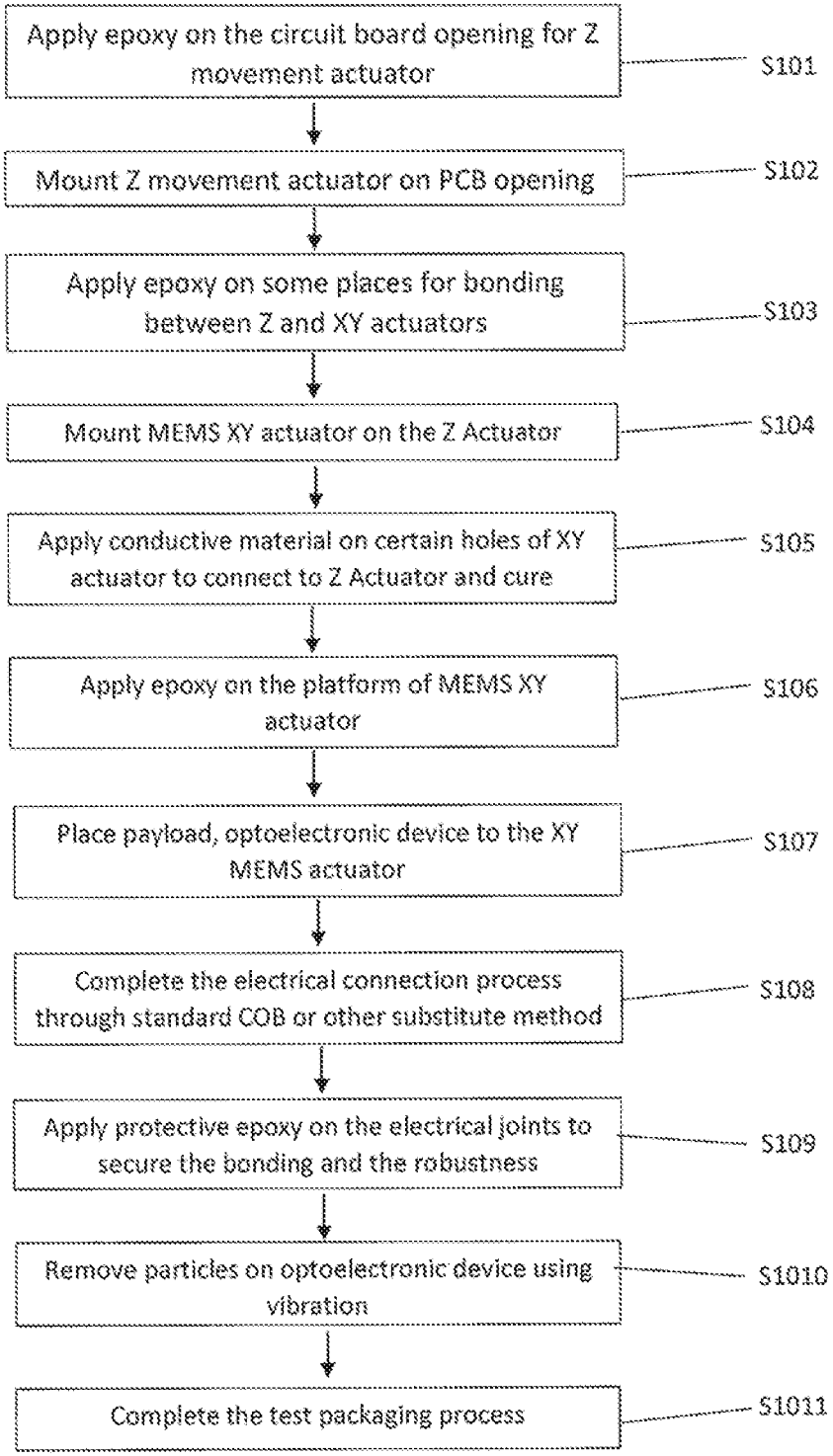
FIG. 12 is a flow diagram for assembling a package including a platform at in-plane and out-of-plane degrees of freedom in accordance with various embodiments of the present disclosure.

FIG. 12 is a flow diagram for assembling an assembly/package for moving a platform in multiple in-plane and out-of-plane degrees of freedom in accordance with various embodiments of the present disclosure. Other methods for forming the various disclosed package embodiments with the in-plane actuator and the and the various disclosed package embodiments with both in-plane and out-of-plane actuators are used in other embodiments.

The first step 101 of the assembly flow is to apply epoxy on the circuit board 12 opening for the bonding of the outer frame 161 of the out-of-plane actuator 160. In other embodiments, other suitable glues or other adhesives are used. Circuit board 12 may have an opening or recess to various depths and in some embodiments the epoxy is applied on an upper surface of the circuit board 12 which may be a printed circuit board, PCB. The out-of-plane actuator 160, which may be a Z piezoelectric actuator, is mounted directly or indirectly on the circuit board in step 102 as in some embodiments there may be another component disposed between the Z piezoelectric actuator 160 and the PCB or other circuit board 12. After curing, the outer frame 161 of the out-of-plane actuator 160 bonds to the PCB or other circuit board 12. The outer frame 161 might be silicon material, which has a matching thermal expansion coefficient comparing to a ceramic circuit board. Outer frame 161 may be formed of other materials and when the outer frame 161 is formed of another material, a flexural outer frame 161 may be used to compensate for any mismatch in thermal expansion.

After the out-of-plane actuator assembly, step 103 involves applying epoxy on the center stage 168 and outer frame 161 of the out-of-plane actuator 160. In other embodiments, other suitable glues or other adhesives may be used. Step 104 is to place MEMS in-plane actuator 150 on the out-of-plane actuator 160. Epoxy curing may then take place. Various curing conditions may be used and other methods for joining MEMS in-plane actuator 150 to out-of-plane actuator 160.

In the curing embodiment, after curing, the in-plane actuator 150 bonds together with the actuator 160 on the PCB. The actuator 160 might have conductive traces to pass through the in-plane actuator 150, as described above. In step S105, conductive epoxy or similar material is provided on associated holes on the in-plane ("XY") actuator 150 to connect and electrically couple to the out-of-plane actuator 160. Curing follows.

In step 106, thermal epoxy or another suitable adhesive, is applied on the bonding area of the platform 153, and then optoelectronic device 154 is joined to the in-plane MEMS actuator 150 in step 107. Various suitable epoxies or other adhesives may be used.

After curing to affix the optoelectronic device 154 to the in-plane actuator 150, step 108 is to complete the electrical connections 158 and 159 through standard COB process or other suitable methods. Step 109 is to apply protective epoxy on the electrical joints to secure the bonding robustness. Other protective materials are used in other embodiments.

If there are particles on the optoelectronic device 154, the particles can be removed by vibrating the optoelectronic device 154 in optional step 1010. The final assembly step 1011 is to mount the holder with window 19 on the circuit board 12.

In general, the various operations of method described herein may be accomplished using or may pertain to components or features of the various systems and/or apparatus with their respective components and subcomponents, described herein.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of figures, block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus, the breadth and scope of the present disclosure should not be limited by any of the above-described example embodiments, and it will be understood by those skilled in the art that various changes and modifications to the previous descriptions may be made within the scope of the claims.

What is claimed is:

1. A micro-electrical-mechanical system (MEMS) actuator comprising;
    a platform adapted for attachment to an optoelectronic device;
    an outer frame surrounding and laterally spaced from said platform;
    electrically conductive flexure wires that extend above an upper surface of an in-plane MEMS actuator of said MEMS actuator and provide conductive coupling between said platform and said outer frame;
    a plurality of comb drive sectors, each including moving and fixed portions, said platform surrounding said plurality of comb drive sectors;
    each said comb drive sector including a plurality of pairs of opposed comb structures, each said pair including a first comb structure with first teeth coupled to a fixed member and a second comb structure with second teeth coupled to a moveable member, said fixed member parallel to said moveable member, and a cantilever coupled between said platform and said moveable member, wherein each said comb drive sector further includes a pair of motion control cantilevers, each disposed at a periphery of said comb drive sector and coupled between said moveable member and said fixed member,
    wherein said first and second teeth are oriented parallel one another and wherein ends of said first teeth and ends of said second teeth form an overlap region in which adjacent ends of said first teeth are interposed between adjacent ends of said second teeth,
    wherein said fixed member includes a plurality of fixed spines, said moveable member includes a plurality of moveable spines, said first teeth extend from a fixed spine of said fixed member towards a moveable spine of said moveable member, and said second teeth extend from a moveable spine of said moveable member towards a fixed spine of said fixed member, said fixed spine parallel to said moveable spine, and wherein said fixed member includes a fixed bar and said plurality of fixed spines are orthogonal to said fixed bar, and said moveable member includes a moveable frame and said plurality of moveable spines are orthogonal to said moveable frame.

2. The MEMS actuator as in claim 1, wherein said first teeth are tapered such that said ends of said first teeth are narrower than other portions of said first teeth and said second teeth are tapered such that said ends of said second teeth are narrower than other portions of said second teeth.

3. The MEMS actuator as in claim 1, wherein each said fixed spine includes said first teeth joined to one side thereof and opposed teeth joined to an opposed side thereof and extending toward a further moveable spine of said moveable member.

4. The MEMS actuator as in claim 1 wherein one end of said cantilever coupled between said platform and said moveable member is attached to said moveable member at a peripheral portion of said comb drive sector.

* * * * *